(12) United States Patent
Acharya et al.

(10) Patent No.: US 6,690,306 B1
(45) Date of Patent: Feb. 10, 2004

(54) METHOD OF GENERATING A LENGTH-CONSTRAINED HUFFMAN CODE

(75) Inventors: Tinku Acharya, Chandler, AZ (US); Ping-Sing Tsai, Gilbert, AZ (US); Hyun M. Kim, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/705,314

(22) Filed: Nov. 3, 2000

(51) Int. Cl.$^7$ ................................................ H03M 7/40
(52) U.S. Cl. ........................................... 341/65; 341/67
(58) Field of Search .............................. 341/65, 67, 51; 348/473

(56) References Cited

U.S. PATENT DOCUMENTS

| | | | | |
|---|---|---|---|---|
| 5,548,338 A | * | 8/1996 | Ellis et al. .................. | 348/473 |
| 6,188,338 B1 | * | 2/2001 | Yokose ......................... | 341/65 |
| 6,208,274 B1 | * | 3/2001 | Taori et al. .................... | 341/67 |

* cited by examiner

Primary Examiner—Jean Bruner Jeanglaude
(74) Attorney, Agent, or Firm—Blakely, Sokoloff, Taylor & Zafman LLP

(57) ABSTRACT

Embodiments are disclosed of generating a length-constrained Huffman code.

18 Claims, 3 Drawing Sheets

| Symbol | Frequency | Huffman Code-length |
|---|---|---|
| S9 | 22 | 3 |
| S10 | 17 | 3 |
| S8 | 17 | 3 |
| S11 | 15 | 3 |
| S7 | 10 | 4 |
| S12 | 9 | 4 |
| S14 | 8 | 4 |
| S5 | 8 | 4 |
| S0 | 8 | 4 |
| S6 | 7 | 5 |
| S4 | 6 | 5 |
| S16 | 5 | 5 |
| S13 | 5 | 5 |
| S15 | 4 | 5 |
| S3 | 3 | 6 |
| S18 | 1.333 | 7 |
| S17 | 1.333 | 8 |
| S2 | 1.333 | 8 |

| Symbol | Frequency (Count) |
|---|---|
| S0 | 8 |
| S1 | 0 |
| S2 | 1 |
| S3 | 3 |
| S4 | 6 |
| S5 | 8 |
| S6 | 7 |
| S7 | 10 |
| S8 | 17 |
| S9 | 22 |
| S10 | 17 |
| S11 | 15 |
| S12 | 9 |
| S13 | 5 |
| S14 | 8 |
| S15 | 4 |
| S16 | 5 |
| S17 | 1 |
| S18 | 2 |

FIG. 1

| Symbol | Frequency | Huffman Code-length |
|---|---|---|
| S9 | 22 | 3 |
| S10 | 17 | 3 |
| S8 | 17 | 3 |
| S11 | 15 | 3 |
| S7 | 10 | 4 |
| S12 | 9 | 4 |
| S14 | 8 | 4 |
| S5 | 8 | 4 |
| S0 | 8 | 4 |
| S6 | 7 | 5 |
| S4 | 6 | 5 |
| S16 | 5 | 5 |
| S13 | 5 | 5 |
| S15 | 4 | 5 |
| S3 | 3 | 6 |
| S18 | 2 | 7 |
| S17 | 1 | 8 |
| S2 | 1 | 8 |

FIG. 2

| Symbol | Frequency | Huffman Code-length |
|---|---|---|
| S9 | 22 | 3 |
| S10 | 17 | 3 |
| S8 | 17 | 3 |
| S11 | 15 | 4 |
| S7 | 10 | 4 |
| S12 | 9 | 4 |
| S14 | 8 | 4 |
| S5 | 8 | 4 |
| S0 | 8 | 5 |
| S6 | 7 | 5 |
| S4 | 6 | 5 |
| S16 | 5 | 5 |
| S13 | 5 | 5 |
| S15 | 4 | 6 |
| S3 | 3 | 7 |
| S18 | 1.333 | 8 |
| S17 | 1.333 | 8 |
| S2 | 1.333 | 8 |

FIG. 3

| Symbol | Frequency | Huffman Code-length |
|---|---|---|
| S9 | 22 | 3 |
| S10 | 17 | 3 |
| S8 | 17 | 3 |
| S11 | 15 | 3 |
| S7 | 10 | 4 |
| S12 | 9 | 4 |
| S14 | 8 | 4 |
| S5 | 8 | 4 |
| S0 | 8 | 5 |
| S6 | 7 | 5 |
| S4 | 6 | 5 |
| S16 | 5 | 5 |
| S13 | 5 | 5 |
| S15 | 4 | 7 |
| S3 | 1.75 | 7 |
| S18 | 1.75 | 7 |
| S17 | 1.75 | 7 |
| S2 | 1.75 | 7 |

FIG. 4

METHOD OF GENERATING A LENGTH-CONSTRAINED HUFFMAN CODE

BACKGROUND

The present disclosure is related to the generation of Huffman codes.

As is well-known, in Huffman coding, greater or longer code lengths are assigned to the less-frequently occurring symbols. Likewise, the two least frequently occurring symbols will have the same code length. See, for example, D. A. Huffman, "A Method for the Construction of Minimum—Redundancy Codes," Proceedings of the IRE, Volume 40 No. 9, pages 1098 to 1101, 1952. As is well-known, Huffman codes of a set of symbols are generated based at least in part on the probability of occurrence of source symbols. A binary tree, commonly referred to as a "Huffman Tree" is generated to extract the binary code and the code length. See, for example, D. A. Huffman, "A Method for the Construction of Minimum—Redundancy Codes," Proceedings of the IRE, Volume 40 No. 9, pages 1098 to 1101, 1952. D. A. Huffman, in the aforementioned paper, describes the process this way:

List all possible symbols with their probabilities;
Find the two symbols with the smallest probabilities;
Replace these by a single set containing both symbols, whose probability is the sum of the individual probabilities;
Repeat until the list contains only one member.

This procedure produces a recursively structured set of sets, each of which contains exactly two members. It, therefore, may be represented as a binary tree ("Huffman Tree") with the symbols as the "leaves." Then to form the code ("Huffman Code") for any particular symbol: traverse the binary tree from the root to that symbol, recording "0" for a left branch and "1" for a right branch. In some circumstances, it may be desirable to constrain or limit the maximum length code for the set of symbols, although state of the art Huffman Tree and/or Huffman Code processes do not generally provide for this.

BRIEF DESCRIPTION OF THE DRAWINGS

The subject matter regarded as the invention is particularly pointed out and distinctly claimed in the concluding portion of this specification. The invention, however, both as to organization and method of operation, together with objects, features, and advantages thereof, may best be understood by reference to the following detailed description when read with the accompanying drawings in which:

FIG. 1 is a table illustrating sample set of 19 symbols and their corresponding frequencies;

FIG. 2 is a table illustrating a Huffman code length table produced for the symbols of FIG. 1 without imposing any restriction on the maximum length code;

FIG. 3 is a table illustrating the code lengths for a Huffman code produced after one iteration of an embodiment in accordance with the present invention above;

FIG. 4 is a table Illustrating the code lengths for 8 Huffman code produced after a second iteration of an embodiment of a method in accordance with the present invention.

DETAILED DESCRIPTION

Figure 5:
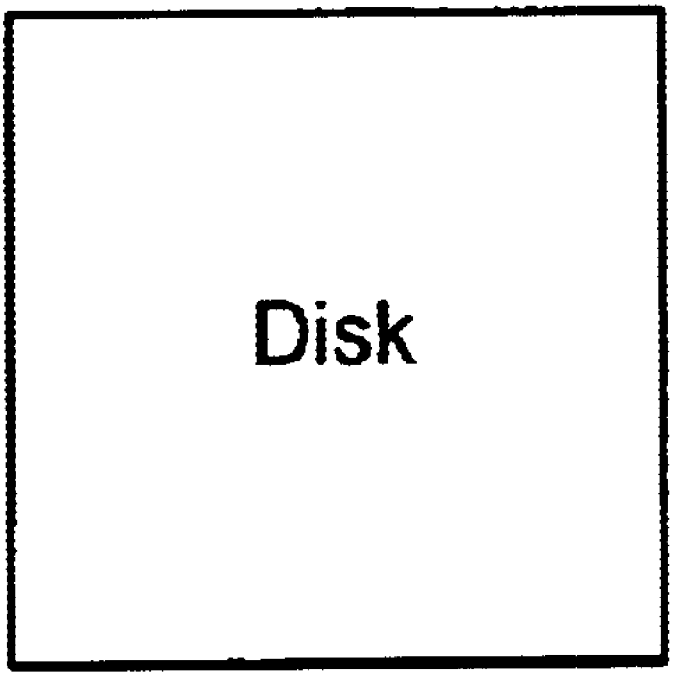
FIG. 5 is a schematic diagram illustrating an embodiment of a storage medium.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously described, and as is well-known, Huffman coding allocates code word length based on the probability of occurrence of the source symbols so that the less frequently occurring symbols will have longer code words. Likewise, the two least frequently occurring symbols will have the same code length. However, in some situations, it may be desirable to restrict the maximum length code to a predetermined code length or number of bits. Likewise, it may be desirable to restrict the amount of the increase in the average code length of the code set when such a constraint is imposed over the average code length for an unconstrained Huffman code.

Ad hoc processes to accomplish the foregoing have been employed. See for example, "Image Video Compression Standards: Algorithms and Architectures," $2^{nd}$ Ed., V. Vhaskarann K. Konstantinides, Kwuler Academic Publishers, p. 32 to 37, 1997. Furthermore, such processes in addition to being ad hoc, do not ensure that the foregoing desirable features, such as a predetermined maximum code length, are obtained and furthermore, such approaches are typically complex to implement in hardware and/or software.

An embodiment of a method of generating a length constrained Huffman code for a set of symbols is provided. For this particular embodiment, a Huffman code is produced for the set of symbols with the restriction that the maximum Huffman code length is less than or equal to some fixed length, X. Furthermore, although the invention is not restricted in scope in this respect, in this particular embodiment, the increase in the average code length over an unconstrained Huffman code is kept as small as feasible.

In this particular embodiment, an "unconstrained" Huffman code is first constructed. This code is based, at least in part, on the frequencies of the respective symbols of the set of symbols for which it is desirable to generate a length constrained Huffman code. It is noted that any one of a number of Huffman code construction techniques may be employed and the invention is not restricted in scope to any particular approach or technique. Once such a Huffman code is produced, a Huffman code table may be constructed to provide the maximum length code, or codes. It may be determined whether the maximum length code for the symbols is greater than the predetermined length constraint. If it is equal to or less than the predetermined length constraint, then the desired Huffman code has been constructed.

However, alternatively, if the maximum length code is greater than the pre-determined length constraint, the frequency of the symbols having the longest codes in the Huffman code table are readjusted. It is noted that, although the invention is not limited in scope in this respect, in this particular embodiment, on an initial iteration, the frequency of the symbols having the three longest codes are readjusted. Here, this number is selected because the symbols having the two least frequently occurring codes have the same code length in a Huffman code. Although readjusting the frequency of the symbols having the three longest codes on the first iteration is applied in this particular embodiment, the invention is not restricted in scope in this respect. In an alternative embodiment, a fewer or greater number of symbols having the longest codes may be readjusted on the first iteration.

In this particular embodiment, the frequency of the symbols having the longest frequency codes are readjusted by averaging the frequency of the symbols having the longest codes, which are, of course, non-zero frequency symbols, because zero frequency symbols are assigned no codes. Once the average frequency of the symbols having the longest codes is obtained, in this case the three longest codes, the frequency of these symbols is changed to that average frequency.

With these readjusted frequencies, a Huffman code is again constructed, a Huffman code table is produced, and the maximum length code is compared with the pre-determined length constraint.

If, again, the maximum length code exceeds the predetermined length constraint, the previously described process is repeated. However, on this next, and, in this example, second iteration, the number of symbols having the longest codes to be readjusted is increased by one symbol. Therefore, in this particular embodiment, on the second iteration, the frequencies of the symbols having the four longest codes are averaged. Of course, again, the invention is not restricted in scope to employing the symbols having the four longest codes on the second iteration. In alternative embodiments, a lesser or greater number of symbols may be employed.

FIG. 1 is a table illustrating a typical symbol set with 19 symbols and the corresponding frequencies. It is, of course, understood that the invention is not limited in scope to this particular example. For this example, assume that the maximum length code is constrained or limited to 7. In such an example, the Huffman code length information may be transmitted across a communications medium or channel using three bits or binary digital signals for each symbol. An application of this example is the GZIP text compression scheme, GZIP is a text compression utility, developed under the GNU (Gnu's Not Unix) project, a project with a goal of developing a "free" or freely available UNIX-like operating system, for replacing the "compress" text compression utility on a UNIX operating system. See, for example, Gailly, J. L. and Adler, M., GZIP documentation and sources, available as gzip-1.2.4.tar at the website "http://www.gzip.orh/". although, again, the invention is not limited in scope in this respect.

FIG. 2 is a table showing the Huffman code lengths produced where a Huffman code is constructed without any restriction on the maximum length code. For this table, the average code length is equal to 3.8378 and the maximum code length in this table is 8. Therefore, if no readjustment of the symbol frequencies were performed, such as in an embodiment in accordance with the present invention, four bits of binary digital signals would be employed for each symbol to transmit the Huffman code length information across communications medium or channel.

FIG. 3 is a table illustrating the results, in terms of Huffman code lengths, after application of an embodiment of the present invention for a single iteration. The shaded regions of the table show the frequency adjustment that has occurred. However, in this example, after one iteration, the maximum code length still exceeds the selected or established code length constraint.

FIG. 4 is a table illustrating Huffman code lengths after application of an embodiment in accordance with the present invention for a second iteration. As illustrated, after the second iteration, the maximum code length, as an example, is reduced to 7 and the average code length is increased to 3.8446. Therefore, the average code length has not been increased on an "unconstrained" Huffman code by a significant amount.

Although the invention is not restricted in scope to the previously described embodiment, nonetheless, it provides a number of advantages. As previously described, it ensures that a code length constraint be complied with or met and, furthermore, it accomplishes this employing a process where the increase in the average code length of the Huffman code set is limited, and in some embodiments, potentially minimized. Another advantage of this particular embodiment is that it employs common or Huffman coding schemes and, therefore, implementation in hardware and/or software is relatively simple and efficient.

It will, of course, be understood that, although particular embodiments have just been described, the invention is not limited in scope to a particular embodiment or implementation. For example, one embodiment may be in hardware, whereas another embodiment may be in software. Likewise, an embodiment may be in firmware, or any combination of hardware, software, or firmware, for example. Likewise, although the invention is not limited in scope in this respect, one embodiment may comprise an article, such as a storage medium. Such a storage medium, such as, for example, a CD-ROM, or a disk, may have stored thereon instructions, which when executed by a system, such as a computer system or platform, or an imaging system, may result in an embodiment of a method in accordance with the present invention being executed, such as a method of generating a length-constrained Huffman code, for example, as previously described While certain features of the invention have been illustrated and described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A method of generating a length-constrained Huffman code for a set of symbols comprising:
   (a) constructing a Huffman code based, at least in part, on the frequencies of the respective symbols;
   (b) readjusting the frequency of the symbols having longest codes if a maximum length code is greater than a predetermined length constraint; and
   (c) repeating (a) and (b) until the maximum length code is equal to or less than the predetermined length constraint.

2. The method of claim 1,
   wherein readjusting the frequency of the symbols having the longest codes comprises readjusting the frequency of the symbols having the three longest codes on a first iteration.

3. The method of claim 2,
   repeating (a) and (b) comprises:
   increasing by one symbol, on each successive iteration, a number of symbols having the longest codes that have their respective frequencies readjusted.

4. The method of claim 1,
   wherein readjusting the frequency of the symbols having the longest symbols comprises:
   averaging the frequency of those symbols; and
   assigning the average frequency as the frequency of each of the respective symbols.

5. The method of claim 4,
   wherein repeating (a) and (b) comprises:
   increasing by one symbol, on each successive iteration, the number of symbols having the longest codes that have their respective frequencies readjusted.

6. A method of generating a Huffman code comprising:
(a) for a selected number of a longest code words in a Huffman code, assigning an average frequency of symbols associated with the longest code words as the frequency of said symbols; and
(b) reconstructing the Huffman code employing said code words.

7. The method of claim 6, and further comprising:
comparing the longest code word of the reconstructed Huffman code against a predetermined length constraint; and
if the predetermined length constraint is exceeded, increasing the selected number of the longest codes words by one; and
repeating (a) and (b).

8. The method of claim 7, and further comprising:
no longer repeating (a) and (b) if the predetermined length constraint is not exceeded.

9. The method of claim 6, wherein on an initial iteration the selected number of longest code words comprises three.

10. An article comprising: a storage medium having stored thereon, instructions that, when executed, result in an execution of a method of generating a length-constrained Huffman code for a set of symbols comprising:
(a) constructing a Huffman code based, at least in part, on the frequencies of the respective symbols;
(b) readjusting the frequency of the symbols having longest codes if a maximum length code is greater than a predetermined length constraint; and
(c) repeating (a) and (b) until the maximum length code is equal to or less than the predetermined length constraint.

11. The article of claim 10,
wherein said instructions, when executed, further result in readjusting the frequency of the symbols having the longest codes that comprises readjusting the frequency of the symbols having the three longest codes on a first iteration.

12. The article of claim 11, wherein said instructions, when executed, further result in repeating (a) and (b) that comprises increasing by one symbol, on each successive iteration, the number of symbols having the longest codes that have their respective frequencies readjusted.

13. The article of claim 10, wherein said instructions, when executed, further result in readjusting the frequency of the symbols having the longest symbols that comprises:
averaging the frequency of those symbols; and
assigning the average frequency as the frequency of each of the respective symbols.

14. The article of claim 13, wherein said instructions, when executed, further result in repeating (a) and (b) that comprises:
increasing by one symbol, on each successive iteration, a number of symbols having the longest codes that have their respective frequencies readjusted.

15. An article comprising: a storage medium having stored thereon, instructions that, when executed, result in an execution of a method of generating a Huffman code comprising:
(a) for a selected number of a longest code words in a Huffman code, assigning an average frequency of symbols associated with the longest code words as the frequency of said symbols; and
(b) reconstructing the Huffman code employing said code words.

16. The article of claim 15, wherein said instructions, when executed, further comprise:
comparing the longest code word of the reconstructed Huffman code against a predetermined length constraint; and
if the predetermined length constraint is exceeded, increasing the selected number of the longest codes words by one; and
repeating (a) and (b).

17. The article of claim 16, wherein said instructions, when executed, further comprise:
no longer repeating (a) and (b) if the predetermined length constraint is not exceeded.

18. The article of claim 15, wherein said instructions, when executed, further comprise, on the initial iteration, the selected number of longest code words being three.

* * * * *